United States Patent [19]

Harter

[11] Patent Number: 4,809,283

[45] Date of Patent: Feb. 28, 1989

[54] METHOD OF MANUFACTURING CHROMIUM-DOPED BERYLLIUM ALUMINATE LASER ROD AND LASERS INCORPORATING THE RODS THEREIN

[75] Inventor: Donald J. Harter, Berkeley Hts., N.J.

[73] Assignee: Allied-Signal Inc., Morris Township, Morris County, N.J.

[21] Appl. No.: 160,737

[22] Filed: Feb. 26, 1988

[51] Int. Cl.⁴ .............................................. H01S 3/16
[52] U.S. Cl. ........................................ 372/41; 372/34
[58] Field of Search ................................... 372/41, 34

[56] References Cited

U.S. PATENT DOCUMENTS 3,866,142  2/1975  Cline et al. ............................. 372/41
3,997,853  12/1976  Morris et al. .......................... 372/41

OTHER PUBLICATIONS

Robert C. Linares, "Research and Development of New Laser Materials", Oct. 30, 1984, p. 25.

Primary Examiner—Léon Scott, Jr.
Attorney, Agent, or Firm—Gerhard H. Fuchs

[57] ABSTRACT

The invention relates to an improved method of making a beryllium aluminate laser rod wherein a crystal is grown by the Czochraslshi technique by core drilling and grinding. The improvement resides in heat treating the rod to release mechanical stresses induced in the single crystal rod by the griding operation to improve its optical properties. The invention also resides in a rod manufactured in this manner and to a laser employing such a rod.

20 Claims, 1 Drawing Sheet

METHOD OF MANUFACTURING CHROMIUM-DOPED BERYLLIUM ALUMINATE LASER ROD AND LASERS INCORPORATING THE RODS THEREIN

BACKGROUND OF THE INVENTION

This invention relates to lasers and, more particularly, to broadly tunable chromium-doped beryllium aluminate lasers. Further, the invention also relates to improved chromium-doped beryllium aluminate laser rods employed in such lasers and the method of manufacturing the improved laser rods.

More particularly, the invention relates to an improved laser rod and method of manufacturing such a laser rod of the type employed in the laser discussed in U.S. Pat. No. 4,272,733, whose disclosure is specifically incorporated by reference herein.

In that patent, laser materials are described as being materials which depend on their ability to absorb energy in such a way that more atoms (or molecules) are excited into a higher energy level than are in the terminal state, rendering the material capable of "stimulated" emission. If light of the appropriate wavelength is incident on such excited material, it will emit additional light having the same wavelength, phase and direction as the incident light. This additional light, by augmenting the intensity of the incident light, demonstrates light amplification. This is a well-known principle demonstrated as early as 1960 using ruby, a crystalline solid system.

This invention relates to what are generally known as host-type lasers which employ a dopant ion incorporated in dilute concentration in a solid host as the laser-active component. The invention disclosed in U.S. Pat. No. 4,272,733 is directed to such a host-type laser wherein the solid host is chromium-doped beryllium aluminate, and to which the present invention is directed and is an improvement thereover.

More specifically, the present invention is directed to an improvement in an "alexandrite" laser which, as used in this specification and as well known in the art, is intended to mean trivalent chromium-doped beryllium aluminate ($BeAl_2O_4:Cr^{3+}$) of the chrysoberyl structure. Typically, alexandrite serves as a host to provide a broadly wavelength-tunable laser which is made up of a laser medium comprising a single crystal of alexandrite having a trivalent chromium doping concentration typically from about 0.002 to 10 atom percent with respect to aluminum sites, means for exciting the laser medium to emit coherent radiation and tuning means for tuning the coherent radiation in a spectral range from red to infrared.

A problem with alexandrite however is that when a crystal of alexandrite which is machined into an alexandrite laser rod is submitted to such a machining procedure, physical stresses are induced, i.e. mechanical stresses, which affect the optical quality on output of the laser rod. More specifically, typically these alexandrite rods are manufactured by conventional core drilling, thereafter grinding and polishing operations. The grinding operation itself induces mechanical stresses on the crystalline structure and this is what ultimately results in deteriorated optical quality upon output. In accordance with the invention, in part a rod is provided which is treated in a manner which corrects and relaxes these induced mechanical stresses or stressing of the single crystalline structure.

SUMMARY OF THE INVENTION

In accordance with one aspect of the invention there is provided an improvement in a method of making solid state laser rods for use in a solid state laser. The method typically comprises the steps of preparing a single crystal beryllium aluminate having a chromium doping concentration effective to permit lasing of the crystal. The beryllium aluminate crystal is prepared by the Czochralski technique from a stoichiometric melt. After the crystal is prepared from the melt it is core drilled and treated to a grinding operation to be fabricated into a laser rod. The improvement consists of further treating the rod by heating in a furnace at a temperature, and for a time, and in an atmosphere effective to release stress which has induced on its crystalline structure by the grinding whereby the optical properties thereof are improved as a result of this further treatment.

In a yet still more specific aspect, the method provides that the treatment is conducted at a temperature of about 800° C. to about 1500° C. in an air atmosphere and further comprises the step of polishing the laser rod after the heat treatment. Alternatively, the laser rod is first polished and thereafter the treatment is conducted at a temperature of about 800° C. to about 1500° C. in an inert atmosphere. As such, the polishing can be conducted prior to the treatment without detrimentally affecting the optical qualities resulting form the polishing operation because there is no reaction at the surface of the crystalline rod with oxygen in the atmosphere. Preferably, the atmosphere in the case of the inert atmosphere is nitrogen and the preferred temperature is about 1300° C. to about 1500° C., more preferably about 1350° C. to about 1400° C. The latter preferred temperatures also supply in the case of treatment in an air atmosphere.

In a specific aspect, the heat treatment is conducted by heating the rod from room temperature to the temperature range preferred at a temperature rate of increase effective to not thermally shocking the rod. Thereafter, the rod is held, i.e., soaked at the temperature range for a time sufficient to cause the release of stress to occur and the rod is then cooled to room temperature at a rate effective to ensure uniform cooling of the rod.

In another aspect, the invention is directed to a broadly wavelength-tunable laser which comprises a laser rod made in accordance with the above-described method. The laser further includes means for exciting the laser rod to emit coherent radiation in combination with tuning means, for tuning the coherent radiation in a spectral range from red to infrared. Mirrors are provided to form an optical resonator, with the resonator enclosing the laser medium and tuning means and adapted for maintaining laser oscillations between the two mirrors. With respect to the tuning means, it can either be a birefringent filter rotatably mounted within the optical resonator, a prism with at least one of the mirrors being pivotably mounted, an optical grating rotatably mounted within the optical resonator or a multilayer dielectric coated filter rotatably mounted within the optical resonator. Preferably the means for exciting the laser medium is one of a pulsed and coherent light source emitting at wavelengths shorter than about 700 nm, more specifically, such a light source being a xenon flash lamp. Alternatively, the means for exciting the laser medium comprises a continuous and coherent light source emitting at wavelength shorter than about 700 nm. Still further, the laser further comprises means for Q-switching the laser with the Q-switching means comprising a Pockels cell and a polarizer.

DETAILED DESCRIPTION OF THE INVENTION

Figure 1:
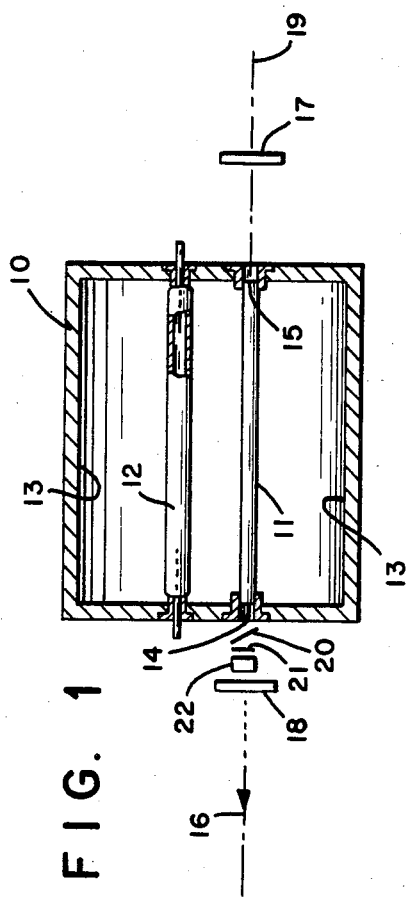
FIG. 1 is a diagramatic illustration, in partial cross-section, of a typical laser apparatus utilizing a laser rod in accordance with the invention, together with tuning means to provide a tunable laser in accordance with one aspect of this invention.

The laser medium employed in this invention comprises a single crystal of alexandrite typically having a trivalent chromium ion doping concentration from about 0.002 to 10 atom percent with respect to aluminum sites, preferably, from about 0.01 to about 1.0 atom percent and more preferably, from about 0.1 to 0.4 atom percent. The laser medium is excited by an optical pumping source and emits coherent radiation. Preferably, the radiation is propagated in a direction substantially along the a-c plane of the crystal with the electric vector polarized substantially perpendicular to the a-c plane. Additional details concerning preparation and characteristics of the laser medium are disclosed in U.S. Pat. Nos. 3,997,853 and 4,272,733, the disclosures of both being or having been specifically incorporated by reference herein.

The laser medium of the present invention may be excited using any suitable optical pumping source, either incoherent or coherent and continuous "cw" or pulsed. Efficient excitation is particularly effected with wavelengths shorter than about 700 nm. Examples of suitable incoherent sources are gaseous discharge lamps filled with xenon and/or krypton, and designed to operate either cw or pulsed, and metallic vapor sources such as mercury, sodium, cesium, rubidium, and/or potassium. A cw mercury arc lamp has been found particularly suitable as a pumping source for cw laser operation, and a pulsed xenon arc lamp particularly suitable as a pumping source for pulsed laser operation.

Coherent pumping sources must have an emission wavelength that is absorbed by the ground state of $Cr^{3+}$ dopant ions but is not absorbed excessively by the excited state. For cw excitation the krypton ion and argon ion lasers are representative. For pulsed laser excitation, almost any coherent source having adequate power and an emission wavelength below 675 nm would be an effective pump for the present laser. Examples of suitable sources are doubled Nd:YAG, Excimer lasers, and nitrogen lasers.

Any conventional tuning means may be used to tune the laser of this invention. Examples of suitable tuning means include a prism, optical grating, birefringent filter, multilayer dielectric coated filter or lens having longitudinal chromatic aberration. Particularly suitable is a birefringent filter of the general type described by G. Holtom and O. Teschke, "Design of a Birefringent Filter for High-Power Dialasers," IEEE J. Quantum Electron. QE-10, 577, 1974. This type of filter is sometimes referred to as a "Lyot filter". (B. Lyot, Compt. Rend. 197, 1593, 1933.)

The tuning continuity of a vibronic laser which is a class of host laser of which alexandrite is a type, depends upon a smooth vibronic profile. Sharp peaks in the vibronic profile result in significant power changes or discontinuities as the laser is tuned. U.S. Pat. No. 4,272,733 teaches that at wavelength above 720 nm the alexandrite vibronic spectrum at room temperature is smooth. This desirable property results because multiphonon processes are chiefly involved in this spectral region at room temperature, and because several multiphonon combinations together produce a vibronic fluorescence. The peaks associated with phonon density of states and coupling strength thus tend to average out.

The tunable range of the laser of this invention while nominally about 700 nm to 820 nm, can be extended to both higher and lower wavelengths using high excitation energy. For example, by using high excitation energy, high gain lasing in the R-line "680.4 nm" was achieved. The wavelength range is also temperature dependent, with higher and lower wavelengths generally attained at elevated and reduced temperatures respectively. In addition, the wavelength range can be extended by several nonlinear methods, including frequency doubling and tripling, tune-excitation parametric oscillators and Raman frequency shifting. Each of these nonlinear frequency shifting techniques give a frequency-tuned output since the input frequency can be tuned.

Compared with ruby, the alexandrite vibronic laser of this invention, like that disclosed in U.S. Pat. No. 4,272,733, and to which the present invention is an improvement thereover has a low excitation threshold and low emission cross-section. Alexandrite also has a high mechanical strength and high thermal conductivity. These properties permit high average power operation, high overall efficiency, and high energy storage. They also make the present laser attractive for applications requiring high power, such as welding, machining and nuclear fusion.

Another potentially useful property of the present laser is the existence of dual sets of excited levels with substantially different fluorescence characteristics. In this regard, the laser in accordance with the invention is operated in the same manner as discussed in U.S. Pat. No. 4,272,733.

FIG. 1 illustrates a tunable laser apparatus of this invention. The laser medium 11, comprising an alexandrite crystal of this invention and pumping source 12, e.g., a cw mercury or a pulsed xenon gaseous discharge pumping source, are housed in container 10 which has a highly reflective inner surface 13 which defines an elliptical cavity. Alternatively, other shape cavities can be used as will be readily apparent to those of ordinary skill in the art. Reflection at surface 13 may be diffused or specular. The axis of the laser medium 11 and the pumping source are each located along a focal line of the ellipse formed by container 10. Laser medium 11 is normally provided with coated ends 14 and 15 having a conventional dielectric antireflection coating. Completely reflecting mirror 17, tuning element 20, and partially reflecting mirror 18 are positioned external to container 10 about cylindrical axis 19 of the laser medium 11. Lasing action is achieved by emission of highly collimated coherent radiation whose wavelength is determined by the orientation of the tuning element 20. The radiation, shown as arrow 16, emanates from partially reflecting mirror 18. Mirrors 17 and 18 may both be partially reflecting.

If necessary to obtain the desired operating temperature, laser medium 11 and pumping source 12 are cooled by a fluid circulated through container 10. This fluid may be air, water, or cryogenic liquid, and optionally may be preheated by conventional means to achieve better temperature control.

Optionally, the laser may include means for Q-switching. These means may comprise a saturable dye absorber, an acousto-optic Q-switch or, as shown in FIG. 1, a polarizer 21 and a Pockels cell 22 placed in the beam path. Polarizer 21 may be omitted, particularly at low excitation power. The Q-switch "spoils" the Q of the cavity for an interval of time during which energy is stored. At the appropriate moment the Q-switch is tuned to the high gain condition, and the stored energy in the medium is suddenly released in a "giant pulse" of very short duration. The laser may also be mode locked.

Figure 2:
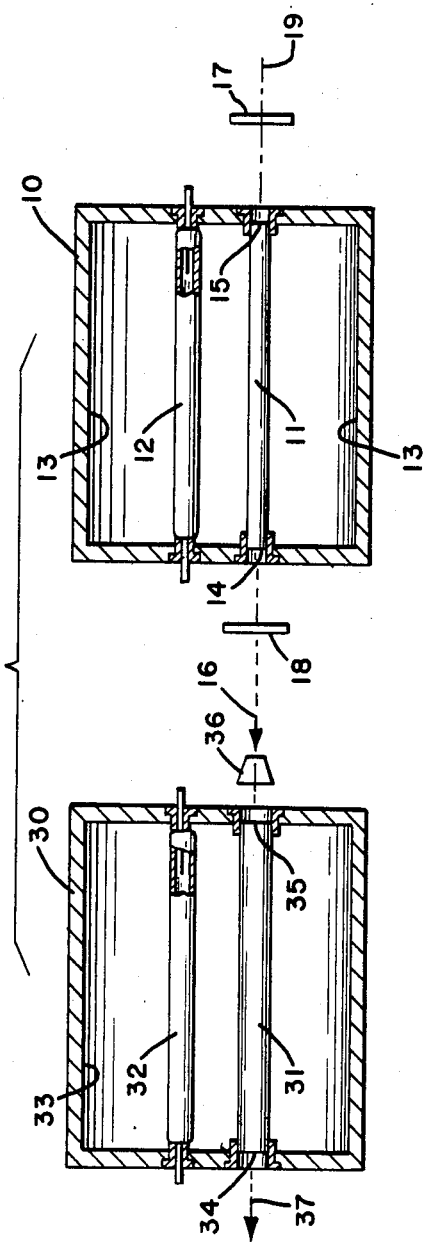
FIG. 2 is a schematic illustration of an oscillator-amplifier laser system.

As shown in FIG. 2 an amplifier stage may be used with the apparatus of FIG. 1 in a high power laser system of this invention. The apparatus of FIG. 1 is then considered the "oscillator stage" of the amplifier. The amplifier stage is located in the output beam of the oscillator stage. It consists essentially of a container 30 which has a highly reflective inner surface 33 which defines an elliptical cavity. An amplifier rod 31, excited by flashlamp 32, is normally provided with coated ends 34 and 35 having a conventional dielectric anti-reflection coating. The amplifier rod may be of larger diameter than the oscillator rod 11, in which case a beam expanding telescope 36 is located between the stages in order to match the beam size to the rod size. Unlike the oscillator stage, the amplifier stage normally does not have mirrors at its ends to form a cavity, and the amplification of the oscillator output occurs during only one pass of the laser beam through the amplifier rod. However, for some amplications, the amplifier may be employed using a high reflector to pass the light back through the rod and a faraday rotator and polarizer to separate the input from the output. The spectral and temporal characteristics of the output of this regenerative oscillator can then be determined by injecting a suitably tailored signal from the primary oscillator in a manner similar to that employed with the single pass amplifier. More than one amplifier stage may be used. The amplified output shown as arrow 37 emanates from amplifier rod 31.

In accordance with the specific more preferred aspects of the invention, with up to now the invention having been described in a manner comensurate with that discussed in U.S. Pat. No. 4,272,733, to which the present invention is an improvement, there is provided for an improved laser rod which performs significantly better than the laser rod discussed in operation in U.S. Pat. No. 4,272,733. The laser rod itself is also grown by the conventional Czochralski techniques in a method of making the solid state laser rods.

More specifically, as background, the method general of growing a rod comprises the steps of preparing a single crystal of beryllium aluminate having a chromium doping concentration effective to permit lasing of the crystal. The crystal is grown by the Czochralski technique from a stoichiometric melt and thereafter is core drilled and processed by grinding into a laser rod. In accordance with the invention, the crystal is thereafter further treated by, preferably after core drilling and grinding, by placing the crystal in a platinum liner with a cover and in a furnace. This liner with a cover serves to keep dust off the surface of the rod. The rod is then annealed in the furnace. More particularly, the annealing is defined in one aspect by being conducted in an air atmosphere with the heating of the furnace controlled by a programmer which ramps it up at a predetermined speed, thereafter holds the rod at the temperature and thereafter ramps it down in a manner such as to not thermally shock it. Preferably, the maximum temperature reached is somewhat below the melt temperature of the crystal, typically no greater than about 1500° C. In a specific aspect of conducting the method in accordance with the invention, the furnace is ramped up with a rod therein to be treated from room temperature to about between 1000° to 1500° C., but it can be as low as 800° C., over a period of 5 hours to preferably, 1350° C. The temperature is then held and the rod allowed to soak, i.e., held at that temperature, depending on the size of the rod, for a time sufficient to release strain induced mechanically by the drilling and grinding. Thereafter, the rod is allowed to cool over about a period of 24 hours back to room temperature with the cooling being conducted at a rate sufficient to avoid thermal shocking of the rod i.e., it is required that the rod is uniformly cooled. After cooling, the rod is then polished and an improved rod usable n the laser in accordance with the invention is provided. Alternatively, if annealing is conducted in an inert atmosphere, the polishing can be done before heat treatment.

EXAMPLE I

A single crystal of [001] (c-axis) of alexandrite containing 0.02–0.03 atom percent $Cr_{3+}$ was prepared by the Czochralski technique from a stoichiometric melt contained in an iridium crucible under flowing nitrogen atmosphere. A c-axis rod of dimensions 7.5 cm long and 0.63 cm in diameter was prepared from the above crystal. The rod was pumped with a single linear xenon flashlamp in a water cooled, silver-coated elliptical cross-section cavity which had an active length of 5.72 cm. Flash duration was 100 microseconds. Laser emission was observed between 750 nm and 756 nm at 35J input, shifting to slightly shorter wavelength when pumped with 50J. A 28J threshold was observed with mirrors reflecting 98% at the laser frequency.

EXAMPLE II

A crystal as in Example I was grown and the crystal, prior to pumping in accordance with Example 1 was placed in a platinum liner with a cover in a furnace under flowing air. The furnace was heated from room temperature to 1350° C. over 5 hours and held at that temperature over 10 hours. Thereafter, the rod was cooled over 24 hours and polished. The rod was then pumped in accordance with Example I in an arrangement similar to that. When the emissions of Example I were compared to that of Example II, it was found that the beam of Example I distorted into a square pattern after propagating approximately 1 to 2 meters. The square pattern was found to be caused by focusing and defocusing in different parts of the rod of Example I. The distortion in the output of the rod of Example II was not observed.

EXAMPLE III

A rod is treated as in Example II except that polishing is conducted prior to treatment and the rod is annealed in a furnace in accordance with Example II but with a flowing nitrogen atmosphere. The rod is then tested in accordance with Example I and similar results to those in Example II are observed.

Although in the above Example III nitrogen is indicated as the atmosphere, it is clear that an inert atmosphere of any type will suffice. For example, helium, argon or xenon as well as other inert gases can be substituted for nitrogen.

In accordance with this invention, it was found that the optical quality of the rods of examples II and III, as well as others made in accordance with the invention, was improved in reducing the wavefront distortion of a light beam propagating throughout the rod, both when being pumped and not being pumped by an incoherent light source such as a xenon flashlamp.

Ideally, pumping of the rod deposits energy uniformally throughout the rod which leads to heating of the material. Since heat is removed from the edge of the rod, the center of the rod is "hotter" than its edges. Because of the refractive index change resulting from the temperature gradient created, the temperature gradient profile leads to thermal lensing in the rod. Since such a thermal profile is, in theory, close to parabolic in nature, the thermal lensing approaches the lensing effect of a perfect lens in a perfect crystal.

In the case with the rod of Example I, the mechanical stresses induced in the alexandrite rod due to grinding causes the thermal lensing effect to deviate further from a perfect lens. This, of course, is deleterious to laser performance.

In accordance with the method of Examples II and III, the thermal lensing characteristics of alexandrite are found to be significantly improved over that of Example I.

What is claimed is:

1. In a method of making solid state laser rods for use in a solid state laser, the method comprising the steps of preparing a single crystal of beryllium aluminate having a chromium doping concentration effective to permit lasing of said crystal, said crystal being prepared by the Czochralski technique from stoichiometric melt, and thereafter core drilling and grinding said crystal into a laser rod, the improvement wherein said rod is further treated by heating in a furnace at a temperature, within the range of about 800° C. to about 1500° C. to release stress induced on its crystal structure by grinding whereby the wavefront distortion of a light beam propagating throughout the rod is reduced.

2. A method as in claim 1 wherein said treatment is conducted in an air atmosphere, and further comprising the step of polishing said laser rod after said heat treatment.

3. A method as in claim 2 wherein said temperature is about 1300° C. to about 1500° C.

4. A method as in claim 3 wherein said temperature is about 1350° C. to about 1400° C.

5. A method as in claim 2 wherein said heat treatment is conducted by heating said rod from room temperature to said temperature range at a temperature rate of increase effective to avoid thermal shocking the rod, thereafter the rod is held at said temperature to cause said release of stress to occur and the rod is then cooled to room temperature at a rate effective to ensure uniform cooling of the rod.

6. A method as in claim 1 wherein said laser rod is first polished, and thereafter said treatment is conducted in an inert atmosphere.

7. A method as in claim 6 wherein said inert atmosphere is nitrogen.

8. A method as in claim 7 wherein said temperature is about 1300° to about 1500° C.

9. A method as in claim 8 wherein said temperature is about 1,350° C. to about 1500° C.

10. A method as in claim 6 wherein said heat treatment is conducted by heating said rod from room temperature to said temperature range at a temperature rate of increase effective to avoid thermal shocking the rod, thereafter the rod is held at said temperature range to cause said release of stress to occur and the rod is then cooled to room temperature at a rate effective to ensure uniform cooling of the rod.

11. A broadly wavelength-tunable laser comprising:
 (a) a laser rod made in accordance with claim 1:
 (b) means for exciting said laser rod to emit coherent radiation:
 (c) tuning means for tuning said coherent radiation in a spectral range from red to infrared: and
 (d) mirrors forming an optical resonator, said resonator enclosing the laser medium and tuning means and adapted for maintaining laser oscillation between the two mirrors.

12. The laser of claim 11 in which the tuning means is a birefringent filter rotatably mounted within the optical resonator.

13. The laser of claim 11 in which the tuning means is a prism and at least one of the mirrors is pivotably mounted.

14. The laser of claim 11 in which the tuning means is an optical grating rotatably mounted within the optical resonator.

15. The laser of claim 11 in which the tuning means is a multilayer dielectric coated filter rotatably mounted within the optical resonator.

16. The laser of claim 11 in which the means for exciting said laser medium comprises a pulsed incoherent light source emitting at wavelengths shorter than about 700 nm.

17. The laser of claim 16 in which the light source comprises a xenon flash lamp.

18. The laser of claim 11 in which the means for exciting said laser medium comprises a continuous incoherent light source emitting at wavelengths shorter than about 700 nm.

19. The laser of claim 11 further comprising means for Q-switching said laser.

20. The laser of claim 19 in which the Q-switching means comprise a Pockels cell and polarizer.

* * * * *